United States Patent
Slik et al.

(10) Patent No.: US 9,823,969 B2
(45) Date of Patent: Nov. 21, 2017

(54) HIERARCHICAL WIDE SPREADING OF DISTRIBUTED STORAGE

(71) Applicant: NetApp, Inc., Sunnyvale, CA (US)

(72) Inventors: David Anthony Slik, Northridge, CA (US); Barry Patrick Benight, San Jose, CA (US)

(73) Assignee: NetApp, Inc., Sunnyvale, CA (US)

( * ) Notice: Subject to any disclaimer, the term of this patent is extended or adjusted under 35 U.S.C. 154(b) by 0 days.

(21) Appl. No.: 15/143,437

(22) Filed: Apr. 29, 2016

(65) Prior Publication Data

US 2016/0239384 A1 Aug. 18, 2016

Related U.S. Application Data

(63) Continuation-in-part of application No. 14/481,311, filed on Sep. 9, 2014, now Pat. No. 9,665,427, which
(Continued)

(51) Int. Cl.
*G06F 11/10* (2006.01)
*H03M 13/15* (2006.01)
(Continued)

(52) U.S. Cl.
CPC ...... *G06F 11/1076* (2013.01); *G06F 11/1092* (2013.01); *G06F 17/30312* (2013.01);
(Continued)

(58) Field of Classification Search
CPC .................................................. G06F 11/1008
(Continued)

(56) References Cited

U.S. PATENT DOCUMENTS

| 4,543,654 A | 9/1985 | Jones |
| 6,115,200 A | 9/2000 | Allen et al. |

(Continued)

FOREIGN PATENT DOCUMENTS

WO 2013152811 A1 10/2013

OTHER PUBLICATIONS

International Search Report and Written Opinion for Application No. PCT/US2015/048177 dated Dec. 10, 2015, 8 pages.
(Continued)

*Primary Examiner* — Fritz Alphonse
(74) *Attorney, Agent, or Firm* — Gilliam IP PLLC (57) ABSTRACT

Systems and techniques for managing data storage are disclosed. In some aspects, a front-end node responds to a request to write an object by dividing the object into multiple source data segments. The front-end node generates redundancy data for the multiple source data segments using a rateless erasure encoding. The front-end node associates a respective subset of the redundancy data with each of the multiple source data segments, wherein each subset of redundancy data and associated source data segment form an encoded segment. The rateless erasure encoding further includes defining multiple segment-level fragments within each of the encoded segments. The front-end node transmits each of the encoded segments to a selected one of multiple storage nodes, wherein each of the selected storage nodes are selected based on a determined storage layout of the encoded segments across the multiple storage nodes. For each of the received encoded segments, the storage node generates one or more protection fragments based on redundancy data generated from the segment-level fragments and stores the segment-level fragments and corresponding protection fragments across multiple storage media devices managed by the selected storage node.

20 Claims, 7 Drawing Sheets

Related U.S. Application Data is a continuation of application No. 14/475,376, filed on Sep. 2, 2014, now abandoned.

(51) Int. Cl.
  *H04L 29/08* (2006.01)
  *G06F 17/30* (2006.01)
  *G06F 3/06* (2006.01)

(52) U.S. Cl.
  CPC ...... *H03M 13/154* (2013.01); *H04L 67/1097* (2013.01); *G06F 2003/0692* (2013.01)

(58) Field of Classification Search
  USPC .......................................... 714/766, 764, 770
  See application file for complete search history.

(56) References Cited

U.S. PATENT DOCUMENTS

| | | | |
|---|---|---|---|
| 6,505,216 B1 | 1/2003 | Schutzman et al. | |
| 6,714,371 B1 | 3/2004 | Codilian | |
| 6,735,033 B1 | 5/2004 | Codilian et al. | |
| 7,177,248 B2 | 2/2007 | Kim et al. | |
| 7,333,282 B2 | 2/2008 | Iseri et al. | |
| 7,408,732 B2 | 8/2008 | Kisaka et al. | |
| 8,099,605 B1 | 1/2012 | Billsroem et al. | |
| 8,239,621 B2 | 8/2012 | Yamato | |
| 8,625,636 B2* | 1/2014 | Baptist | H04L 67/1097 370/474 |
| 8,768,983 B2* | 7/2014 | Kohlscheen | G06F 17/30011 707/827 |
| 8,819,259 B2 | 8/2014 | Zuckerman et al. | |
| 8,838,911 B1 | 9/2014 | Hubin et al. | |
| 8,949,449 B2 | 2/2015 | Zuckerman et al. | |
| 8,959,281 B1 | 2/2015 | Malina et al. | |
| 8,959,305 B1 | 2/2015 | Lecrone et al. | |
| 8,990,162 B1 | 3/2015 | Kushwah et al. | |
| 9,329,991 B2 | 5/2016 | Cohen et al. | |
| 9,361,301 B1 | 6/2016 | Bushman | |
| 2003/0105852 A1* | 6/2003 | Das | G06F 11/1482 709/223 |
| 2004/0162940 A1 | 8/2004 | Yagisawa et al. | |
| 2006/0271339 A1 | 11/2006 | Fukada | |
| 2007/0104049 A1 | 5/2007 | Kim et al. | |
| 2007/0156405 A1 | 7/2007 | Schulz et al. | |
| 2007/0177739 A1 | 8/2007 | Ganguly et al. | |
| 2007/0203927 A1 | 8/2007 | Cave et al. | |
| 2008/0126357 A1 | 5/2008 | Casanova et al. | |
| 2008/0151724 A1 | 6/2008 | Anderson et al. | |
| 2008/0201336 A1 | 8/2008 | Yamato | |
| 2008/0201401 A1 | 8/2008 | Pugh et al. | |
| 2009/0100055 A1 | 4/2009 | Wang | |
| 2009/0154559 A1 | 6/2009 | Gardner | |
| 2009/0327840 A1 | 12/2009 | Moshayedi | |
| 2010/0030960 A1 | 2/2010 | Kamalavannan et al. | |
| 2010/0064166 A1 | 3/2010 | Dubnicki et al. | |
| 2010/0094921 A1 | 4/2010 | Roy et al. | |
| 2010/0094957 A1 | 4/2010 | Zuckerman et al. | |
| 2010/0095060 A1 | 4/2010 | Strange et al. | |
| 2010/0162031 A1* | 6/2010 | Dodgson | H04L 63/104 714/4.1 |
| 2010/0293354 A1 | 11/2010 | Perez et al. | |
| 2011/0191629 A1 | 8/2011 | Daikokuya et al. | |
| 2011/0296104 A1 | 12/2011 | Noda et al. | |
| 2012/0060072 A1 | 3/2012 | Simitci et al. | |
| 2013/0238235 A1 | 9/2013 | Kitchel et al. | |
| 2014/0013046 A1 | 1/2014 | Corbett et al. | |
| 2014/0108707 A1 | 4/2014 | Nowoczynski et al. | |
| 2014/0207899 A1 | 7/2014 | Mark et al. | |
| 2014/0237024 A1 | 8/2014 | Chen et al. | |
| 2014/0297680 A1 | 10/2014 | Triou, Jr. et al. | |
| 2014/0331085 A1 | 11/2014 | Dhuse et al. | |
| 2014/0344532 A1 | 11/2014 | Lazier | |
| 2015/0067245 A1 | 3/2015 | Kruger | |
| 2015/0256577 A1 | 9/2015 | Gutiérrez et al. | |
| 2015/0269964 A1 | 9/2015 | Fallone et al. | |
| 2015/0378825 A1 | 12/2015 | Resch | |
| 2016/0179621 A1 | 6/2016 | Schirripa et al. | |
| 2016/0314043 A1 | 10/2016 | Slik | |

OTHER PUBLICATIONS

Amer, et al., "Design Issue for a Shingled Write Disk System," 26th IEEE Symposium on Massive Storage Systems and Technologies (MSST 2010), retrieved on Apr. 29, 2016 from http://storageconference.us/2010/Papers/MSST/Amer.pdf, May 2010,12 pages.

Amer, et al.,"Data Management and Layout for Shingled Magnetic Recording," IEEE Transactions on Magnetics, retrieved on Apr. 29, 2016 from http://www.ssrc.ucsc.edu/Papers/amer-ieeetm11.pdf, Oct. 2011,vol. 47, No. 10,pp. 3691-3697.

Dunn, et al., "Shingled Magnetic Recording Models, Standardization, and Applications," SNIA Education, Storage Networking Industry Association, retrieved on Apr. 29, 2016 from http://www.snia.org/sites/default/files/Dunn-Feldman_SNIA_Tutorial_Shingled_Magnetic_Recording-r7_Final.pdf, Sep. 16, 2014, 44 pages.

Feldman, et al., "Shingled Magnetic Recording Areal Density Increase Requires New Data Management," USENIX, The Advanced Computing Systems Association, retrieved Apr. 29, 2016 from https://www.cs.cmu.edu/~garth/papers/05_feldman_022-030_final.pdf, Jun. 2013, vol. 38, No. 3, pp. 22-30.

Gibson, et al., "Direction for Shingled-Write and Two-Dimensional Magnetic Recording System Architectures: Synergies with Solid-State Disks," Carnegie Mellon University, Parallel Data Lab, Technical Report CMU-PDL-09-104, retrieved on Apr. 29, 2016 from http://www.pdl.cmu.edu/PDL-FTP/PDSI/CMU-PDL-09-104.pdf, May 2009,2 pages.

Gibson, et al., "Principles of Operation for Shingled Disk Devices," Carnegie Mellon University, Parallel Data Laboratory, CMU-PDL-11-107, retrieved on Apr. 29, 2016 from http://www.pdl.cmu.edu/PDL-FTP/Storage/CMU-PDL-11-107.pdf, Apr. 2011, 9 pages.

Li, X., "Reliability Analysis of Deduplicated and Erasure-Coded Storage," ACM SIGMETRICS Performance Evaluation Review, vol. 38, No. 3, ACM New York, NY, Jan. 3, 2011, pp. 4-9.

Luo, "Implement Object Storage with SMR based Key-Value Store," 2015 Storage Developer Conference, Huawei Technologies Co., retrieved on Apr. 29, 2016 from http://www.snia.org/sites/default/files/SDC15_presentations/smr/QingchaoLuo_Implement_Object_Storage_SMR_Key-Value_Store.pdf, Sep. 2015, 29 pages.

Megans, "Spectra Logic Announces Breakthrough in Nearline Disk, ArcticBlue," SPECTRA Logic, Boulder, CO, retrieved on Apr. 29, 2016 from https://www.spectralogic.com/2015/10/15/spectra-logic-announces-breakhrough-in-nearline-disk-arcticblue/, Oct. 15, 2015, 5 pages.

O'Reily., "RAID Vs. Erasure Coding", Network Computing, retrieved on Apr. 1, 2016 from http://www.networkcomputing.com/storage/raid-vs-erasure-coding/1792588127, Jul. 14, 2014, 2 pages.

Renzoni, R., "Wide Area Storage From Quantum," Quantum Corporation, 2012, 24 pages.

Seshadri S., "High Availability and Data Protection with EMC Isilon Scale-Out NAS," EMC Corporation, White Paper, retrieved on Apr. 29, 2016 from https://www.emc.com/collateral/hardware/white-papers/h10588-isilon-data-availability-protection-wp.pdf, Jun. 2015, 37 pages.

SMR Layout Optimisation for XFS, retrieved on Apr. 29, 2016 from http://xfs.org/images/f/f6/Xfs-smr-structure-0.2.pdf, Mar. 2015, v0.2, 7 pages.

Speciale P., "Scality Ring: Scale Out File System & Hadoop over CDMI," Scality, Storage Developer Conference, retrieved on Apr. 29, 2016 from http://www.snia.org/sites/default/files/PaulSpeciale_Hadoop_Ring.pdf, Sep. 19-22, 2014, 26 pages.

Suresh, et al., "Shingled Magnetic Recording for Big Data Applications," Parallel Data Laboratory, Carnegie Mellon University, Pittsburg, PA, CMU-PDL-12-105, retrieved on Apr. 29, 2016 from (56) References Cited

OTHER PUBLICATIONS http://www.pdl.cmu.edu/PDL-FTP/FS/CMU-PDL-12-105.pdf, May 2012, 29 pages.

* cited by examiner

HIERARCHICAL WIDE SPREADING OF DISTRIBUTED STORAGE

PRIORITY CLAIM

This application is a continuation-in-part of U.S. patent application Ser. No. 14/481,311, filed on Sep. 9, 2014, titled "HIERARCHICAL DATA STORAGE ARCHITECTURE," which is a continuation of U.S. patent application Ser. No. 14/475,376, filed on Sep. 2, 2014, titled "WIDE SPREADING DATA STORAGE ARCHITECTURE," the content of both of which is incorporated by reference herein.

BACKGROUND

The disclosure generally relates to the field of data storage systems, and more particularly to implementing hierarchical erasure coding in a wide spreading storage layout configuration.

Consumer enterprises collect and store increasingly large amounts of data. In many instances, data is stored and frequently archived even prior to any decision being made about whether and how to utilize the stored data. Although the per unit cost associated with storing data has declined over time, the total costs for storage has increased for many companies due to massively increasing data storage volumes. Hence, it is important for companies to find cost-effective ways to manage their data storage environments for storing and managing large quantities of data.

Traditional data protection mechanisms, e.g., RAID, are increasingly ineffective in petabyte-scale systems as a result of: larger drive capacities (without commensurate increases in throughput), larger deployment sizes (mean time between faults is reduced) and lower quality drives. The trend toward less expensive storage hardware is making traditional RAID increasingly difficult to implement reliably, requiring complex techniques, e.g., triple parity, declustering. Therefore, the traditional data protection mechanisms are ill-suited for the emerging capacity storage market needs.

In addition to RAID, data storage systems may implement erasure coding techniques to protect stored data. Erasure coding protection generally entails dividing stored data entities (e.g., data objects) into fragments and encoding to include redundant data. Having been expanded with the redundant data, the fragments may be stored across a set of different storage media locations. Such erasure coding techniques often impose substantial I/O processing for storage devices and network bandwidth consumption for reading or reconstructing data objects. The processing and network bandwidth costs for protection purposes together with providing client access subjects the storage devices to excessive wear. In order to maintain the same storage resiliency, the storage devices may have to be replaced with new ones regularly, which may substantially increase storage costs.

BRIEF DESCRIPTION OF THE DRAWINGS

Aspects of the disclosure may be better understood by referencing the accompanying drawings.

DESCRIPTION

The description that follows includes example systems, methods, techniques, and program flows that embody aspects of the disclosure. However, it is understood that this disclosure may be practiced without some of these specific details. In other instances, well-known instruction instances, protocols, structures and techniques have not been shown in detail in order not to obfuscate the description.

Introduction

Techniques and systems disclosed herein are related to a data storage architecture for providing enhanced storage resiliency. Storage resiliency or data durability characterizes the extent to which a data object can be recovered following the loss of one or more storage devices storing portions of the object. The disclosed data storage structures and techniques are incorporated in a multi-tier configuration that implements wide spreading erasure coding in cooperation with hierarchical erasure coding. In one aspect, wide spreading is implemented by a front-end storage node that processes client I/O requests, such as may be received from a primary storage node. Wide spreading erasure coding includes generating multiple redundant portions of a data object by encoding the data object using a rateless erasure code. For example, the Luby transform codes are classified as rateless because the utilized encoding algorithms are capable of generating a limitless number of encoding symbols. Raptor codes are an advanced class of Fountain code that uses a fixed rate pre-coding stage and a rateless (e.g., Luby transform) stage to generate a number of encoded symbols, a subset of which can be decoded to regenerate the source data.

Wide spreading may further include segmenting and fragmenting data objects into fixed-size segments/fragments to which the rateless erasure code may be applied to generate encoded segments. In some aspects, wide spreading includes a front-end node identifying or otherwise determining multiple backend storage nodes to which the encoded segments are to be stored. The front-end node may select the storage nodes based on storage resiliency gained by virtue of maximum physical distribution. In an aspect, each of the segments comprises multiple fragments that are generated as part of the rateless erasure coding process. The front-end node maintains records, such as within indices, having entries that associated object identifiers with the generated segments and generated fragments within each of the segments.

In an aspect, the front-end node transmits the encoded segments to respective ones of the selected nodes based on a determined segment layout. The storage nodes receive and further encode the encoded segments. In some aspects, the storage nodes process the segment-level fragments received with the segment and generate additional, protection fragments that contain redundancy data for each of the segment-level fragments. In case of a storage media device failure resulting in loss of fragments, a segment processor within a storage node may reconstruct the lost fragment(s) using the remaining source fragments and the protection fragments. Each of the storage nodes may store each of the segment-level fragments and each of the corresponding protection fragments to a different storage media device. The storage media devices managed by a given storage node may be configured within storage shelves and storage racks, where each storage rack includes a number of storage shelves and each storage shelf includes a number of storage media devices. The storage racks/shelves/devices can be distributed across various geographical locations.

Example Illustrations

Figure 1:
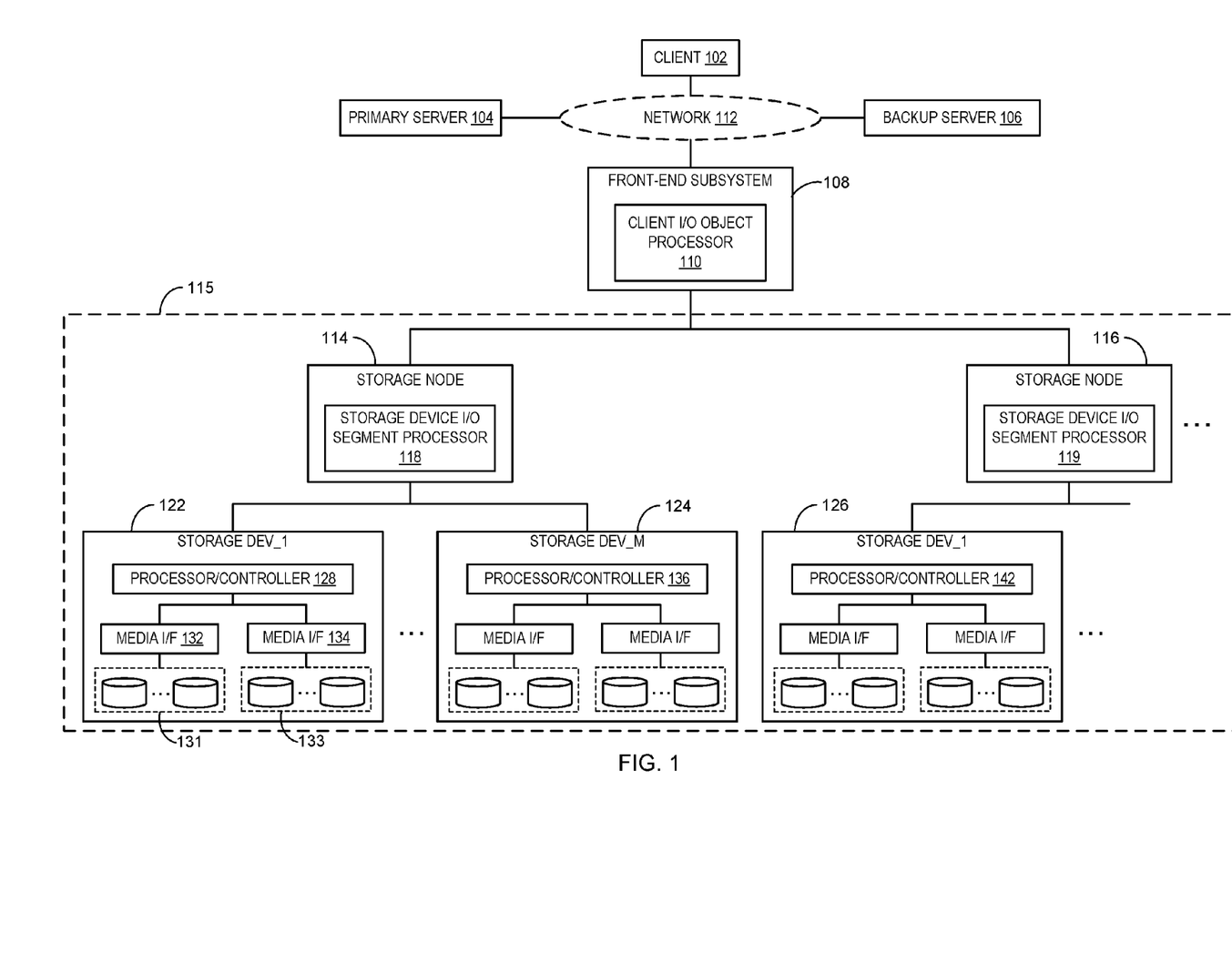
FIG. 1 is a block diagram depicting a storage system that implements hierarchical wide spreading of distributed storage in accordance with some aspects.

FIG. 1 is a block diagram depicting a storage environment that implements hierarchical wide spreading of distributed storage in accordance with some aspects. The storage environment includes a storage subsystem 115 having a number of storage nodes including storage node 114, storage node 116, etc. As shown, each of the storage nodes is associated with a set of backend storage media devices that is manages. For example, storage node 114 is associated with and manages the storage operations directed to a set of M storage media devices that include storage media device 122 and storage media device 124. Similarly, storage node 116 is associated with and manages the storage operations directed to a set of storage devices beginning with storage media device 126.

In some aspects, the storage media devices can be discrete storage devices such as storage cartridges that may be deployed within a storage rack. The storage media devices may also or alternatively comprise logically associated sets of storage cartridges, such as may comprise a storage shelf within a storage rack. The storage media devices include storage media such as storage media 131 and 133. Storage media may comprise magnetic disk drives, solid state drives, magnetic tape devices, etc., and/or any combination of different types of drives (e.g., magnetic disk drives and solid state drives). The storage media may be configured within one or more storage racks each of which may include one or more of the storage nodes. Each of the storage media devices further includes a respective processor or controller such as processors/controllers 128, 136, and 142 that manage object access operations via media interfaces such as media interfaces 132 and 134.

The depicted storage system further includes a front-end node 108 that facilitates storing and/or retrieving data to and from the storage media devices. A single front-end node is depicted for clarity of description. The operational principles disclosed with reference to FIG. 1 and subsequent figures apply to configurations that implements multiple front-end devices. Front-end node 108 is configured, using any combination of coded software, firmware, and/or hardware, to process data storage requests from a variety of different types of clients. As shown, front-end node 108 is communicatively coupled to a primary server 104, a backup server 106, and a user client 102 via a network 112. Primary server 104 may be a source storage server that is generally accessed by user clients such as user client 102 to access stored data during runtime operations. Backup server 106 may a backup storage server to which the "active" data on primary storage server 104 is copied to for runtime backup purposes, such as in the event of interruption of the operations of primary server 104.

Front-end node 108 may be configured as the front-end, client facing interface for receiving and processing a variety of data storage requests from any one or more of primary and backup storage servers 104 and 106 as well as user client 102. For example, front-end node 108 may be configured to receive and process data object read requests from user client 102 to locate and retrieve data objects stored across the storage media devices. In some aspects, the depicted storage subsystems including primary storage server 104, backup storage server 106, and front-end node 108 are configured as object-based storage systems that manage data as discretely named and accessed objects within object containers. Front-end node 108 stores objects received from the clients such as during an object store archive cycle. If front-end node 108 receives requests to write data organized in a different format, such as a hierarchical file system format, it can convert the data into data objects before storing the data within storage subsystem 115.

The depicted storage environment supports a hierarchical wide spreading configuration implemented by respective configurations of front-end node 108 and the backend storage nodes including nodes 114 and 116. Front-end node 108 includes an object processor unit 110 that is configured, using any combination of coded software, firmware, and/or hardware, to sequentially encode received objects. In some aspects, object processor unit 110 applies a forward error correction (FEC) code to objects to generate redundancy data (e.g., parity data) that can be utilized to recover the respective objects in case of system, device, or media component failure that results in loss of some object data. Examples of FEC codes that may be applied include fixed rate erasure codes such as Reed-Solomon codes and rateless erasure codes such as the RaptorQ Luby transform class code.

As utilized herein, a rate or code rate of an erasure code is a proportion of a given set of data that is non-redundant with respect to the original, non-encoded data. Assuming k symbols of original data, the code rate is k/n, for an erasure code that generates n total data symbols of which n-k are redundant. Rateless erasure codes (also known as fountain class codes) are a class of erasure codes characterized, at least in part, by the property that a potentially limitless sequence of encoded symbols can be generated from the original (source) set of symbols. The source symbols are recoverable from any subset of the encoded symbols that is the same size or slightly larger than the number of source symbols. It follows that rateless erasure codes are also characterized as not exhibiting a fixed code rate.

In some aspects, object processor unit 110 implements one aspect of "wide spreading," by segmenting each received data object and applying rateless erasure encoding to the segmented source object data to generate encoded segments each including multiple fragments. As explained in further detail with reference to FIGS. 2-4, object processor unit 110 includes or otherwise accesses in-memory object buffers each having a fixed size. The object buffers are utilized to initially stage incoming object data for erasure coding that generates and stores redundancy data in association with the object data within each buffer. Each of the object buffers is configured to comprise specified data ranges and protections ranges that are interleaved with the data ranges. The data ranges contain the original source object data (i.e., a portion of data from an object). The protection ranges remain empty until redundancy data for the multiple data ranges is generated and respective sub-portions of the redundancy data are stored in each of the protection ranges. While fixed size buffers are used in the depicted example, other examples may utilize various buffer sizing.

In some aspects, encoded segments are formed from adjacent data range and protection range pairs. As part of or following forming the encoded segments, object processor unit 110 may further logically divide each of the encoded segments into fragments (alternately referred to as "segment-level fragments"). Object processor unit 110 further processes the encoded segments and segment-level fragments to implement another aspect of wide spreading in which each individual encoded segment is assigned and transmitted to a selected one of the storage nodes within storage subsystem 115. In some aspects, object processor unit 110 maintains storage layout information that identifies the storage nodes and indicates storage parameters and metrics associated with the individual storage nodes. To maximize storage resiliency of individual objects, object processor unit 110 may maximize encoded segment distribution by selecting and transmitting each encoded segment belonging to a same data object to a different one of the storage nodes.

Each of the encoded segments is further processed by a segment processor unit within each of the respective nodes to which the encoded segments were sent. For example, storage nodes 114 and 116 include segment processor units 118 and 119, respectively, which cooperatively and in cooperation with object processor 110 implement hierarchical wide spreading. The segment processor units are configured, using any combination of coded software, firmware, and/or hardware, to re-encode the segment-level fragments of each segment and distribute the re-encoded fragments across storage media devices such as those depicted within storage devices 122, 124, and 126.

When a client system, e.g., client 102, requests to access a data object, front-end node 108 determines the storage layout of the data segments in terms of which storage nodes the segments are stored in. Object processor unit 110 may access a local object index that associates object IDs with corresponding encoded segments and/or segment-level fragments, or may multicast or otherwise send a request to each of the storage nodes to obtain index information. In an aspect, object processor unit 110 may multicast or otherwise send a request to each of the storage nodes to access the data object. The object access request (e.g., read) may have been generated based on a GET object request transmitted originally by user client 102. In some aspects, the object access request specifies the object identifiers (keys) that object processor unit 110 assigned to each of the segment-level fragments for the object.

Each of the storage nodes maintains tables or other records specifying, by fragment ID, which segment-level fragments are stored in the node. In response to receiving the multicast object access request, a storage node, such as storage node 124, determines whether or not any of the fragments identified in the request are locally stored (i.e., stored on storage media managed by the storage node). In response to determining that one or more fragments are locally stored, the storage node issues corresponding fragment access requests to the one or more storage media devices on which the fragments are stored. The storage node obtains the segment-level fragments, and if needed, the protection fragments for a segment from the storage devices and decodes them to generate the encoded segment that was originally constructed by object processor unit 110. The storage node transmits the encoded segment to object processor unit 110 which decodes the segment and other encoded segments to generate the original source data object which is transmitted by front-end node 108 to user client 102. In some aspects, the object processor unit 110 generates the original source object in response to receiving at least the minimum number of segments required to regenerate the data object.

Figure 2:
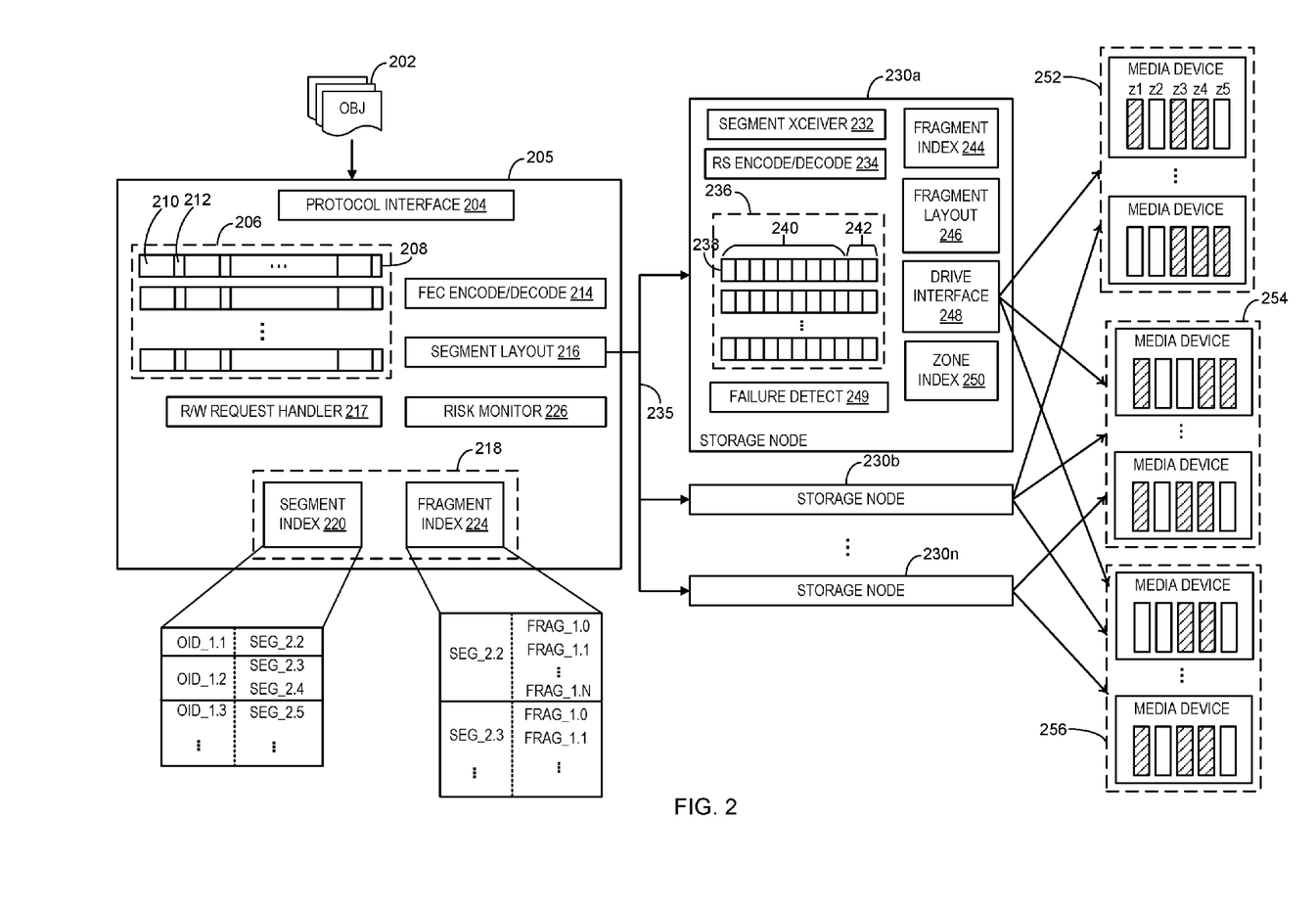
FIG. 2 is a block diagram illustrating subsystems and components of a front-end node and multiple backend storage nodes that cooperatively implement hierarchical wide spreading in accordance with some aspects.

FIG. 2 is a block diagram illustrating a storage system including subsystems and components of a front-end node and multiple backend storage nodes that cooperatively implement hierarchical wide spreading in accordance with some aspects. The front-end node and multiple backend storage nodes depicted in FIG. 2 can be implemented, for example, in the storage environment shown in FIG. 1. The storage system includes a front-end node 205 that facilitates data storage and retrieval from a set of storage media devices 252, 254, and 256. Front-end node 205 may comprise one or more computer systems connected to a set of multiple storage nodes 230a-230n over a network 235, which may be a wide area or local network.

Front-end node 205 includes a protocol interface unit 204 that defines one or more interfaces that applications and devices utilize to store, retrieve, update, and delete data elements from the storage system. For example, protocol interface unit 204 may implement a Cloud Data Management Interface (CDMI), a Simple Storage Service (S3) interface, or both. Front-end node 205 further includes an in-memory area 218 in which a segment index 220 and a fragment index 222 are stored. The data structures including 220 and 224 are generated and/or utilized by one or more components within or accessible to front-end node 205. Segment index 220 records segment identifiers in association with object namespace indexing data to facilitate client interactions such as object PUT and GET requests through protocol interface unit 204. For example, the depicted segment index 220 includes multiple entries including a first row-wise entry that associated the object ID, OID_1.1, with an encoded segment ID, SEG_2.2. This entry may be accessed by a request handler 217 using an object ID, such as may be specified by an object GET or ready request, as an index value to identify the segment SEG_2.2 that contains object data. Multiple segment IDs may be associated with a single object ID, with each of the corresponding segments containing object data for the object corresponding to the object ID. For instance, the second entry of segment index 220 associates segment identifiers SEG_2.3 and SEG_2.4 with the same object ID, OID_1.2. Segment index 220 may also record and manage one or more object namespaces based on container (also referred to as bucket) identifiers that are associated with object identifiers for objects belonging within the respective containers.

Fragment index 224 records fragment identifiers in association with corresponding encoded segment IDs. For example, the depicted fragment index 224 includes multiple entries including a first row-wise entry that associates the segment ID, SEG_2.2, with the fragment IDs FRAG_1.0 through FRAG_1.N. This entry may be accessed by a request handler 217 using an object ID, such as may be specified by an object GET or ready request, as an index value to identify the segment SEG_2.2 that contains object data.

Front-end node 205 further comprises an in-memory staging area 206 that functions as a temporary cache to process payload data from an object PUT or other type of object write request received at protocol interface unit 204. Staging area 206 contains multiple object buffers including a buffer 208, each the same size (e.g., 32 Mbytes). Each of the object buffers includes multiple data ranges and protection ranges. For example, buffer 208 may include 16 data ranges including a data range 210, and 16 interleaved protection ranges including a protection range 212.

Front-end node 205 further includes an encode/decode unit 214 that is configured, using any combination of coded software, firmware, and/or hardware, to apply rateless erasure coding to data objects received via protocol interface 204. Encode/decode unit 214 fragments object data into a number of source data segments from which redundancy data is generated. Assume, for example, that each of object buffers 206 have a 32 Mbyte capacity and are partitioned into 16 data ranges and 16 interleaved protection ranges. Encode/decode unit 214 may be configured to stage object data into buffers 206 in 26.6 Mbyte increments (or an entire object when less than or equal to 26.6 Mbytes). When 26.6 Mbytes have been received and staged within an object buffer, data protection process begins, with the next 26.6 Mbytes of object data being staged concurrently in a subsequent object buffer. If the length of the object data (or remaining object data) is less than the source data range capacity (e.g., 26.6 Mbytes), the data range(s) are padded with zeros.

The staging and protection processing performed by encode/decode unit 214 includes dividing the received object data into equal size source data segments with are inserted into each of the data ranges within a buffer. Encode/decode unit 214 may divide the next sequentially received 26.6 Mbytes of object data into 16 source data segments that are each inserted into a respective one of the data ranges. Continuing with the example of 32 Mbyte object buffers, encode/decode unit 214 performs rateless erasure encoding on the 16 source data segments to generate 5.3 Mbytes of redundancy information. In some aspects, the encode/decode unit 214 performs the encoding based on one or more FEC erasure coding techniques. In some aspects, the rateless erasure coding includes a fixed rate pre-coding stage and a rateless inner coding stage. For example, encode/decode unit 214 may implement RaptorQ erasure encoding in which redundancy fragments are generated for each of the total (e.g., 16) source data segments and inserted into the protection ranges within the buffer. Following encoding of the source data within a buffer, the source data within each data range and the protection data (redundancy fragments) within an adjacent protection field form an encoded segment. The redundancy data distributed across the multiple encoded segments (e.g., 16 segments) can be utilized to reconstruct the 26.6 Mbytes of original object data in case some of the object data is lost, such as due to storage media failure.

Front-end node 205 is further is configured, using any combination of coded software, firmware, and/or hardware, to store information for the object data and corresponding encoded segments within object index 220 and segment index 224, respectively.

Front-end node 205 further includes a segment layout unit 216 that is configured, using any combination of coded software, firmware, and/or hardware, to determine a distribution of the encoded segments (layout) among multiple storage nodes. To determine segment layout, segment layout unit 216 identifies a set of storage nodes 230a-230n that are available to store object data. Segment layout unit 216 further selects a number of the storage nodes 230a-230n to distribute the encoded segments of a particular object across (i.e., the storage layout for one data object). In some aspects, segment layout unit 216 determines the optimal layout of encoded segments to meet the service level objectives (SLOs) and/or to maximize storage resiliency. In some aspects, the number and identity of selected storage nodes is based on targeting maximum distribution of the segments (i.e., minimum number of segments being stored to a same storage node).

In some aspects, segment layout unit 216 uses storage node capacity and reliability information from a risk monitor unit 226 to select the storage devices on a weighted basis. Risk monitor unit 226 may determine based on locally stored or remotely accessed information, the status of each of storage nodes 230a-230n in terms of available capacity, device usage levels, failure trends, etc. Segment layout unit 216 may utilize input from risk monitor unit 226 to compute weighting factors for the storage nodes and determine the number and/or identities of the storage nodes to which to send the encoded segment based thereon.

Segment layout unit 216, in cooperation with a transceiver unit (not depicted) transmits the encoded segments to the selected storage nodes among storage nodes 230a-230n for further processing and storage. FIG. 2 depicts components within storage node 230a that are representative of components included in some or all of the other storage nodes. As shown, storage node 230a includes a transceiver unit 232 that is configured to receive and transmit encoded segments and other information from and to front-end node 205 via network 235. Storage node 230a further includes a fixed rate erasure coding unit, RS encode/decode unit 234, which is configured to re-encode encoded segments received from front-end node 205 using Reed-Solomon encoding. For example, in response to receiving an encoded segment comprising 16 segment-level fragments, encode-decode unit 234 determines redundancy data for the 16 fragments and may generate two additional fragments containing the redundancy data. As a set, the segment-level fragments and corresponding protection/parity fragments may be referred to herein as storage-level fragments.

An in-memory staging area 236 is used to stage the received encoded segments and the redundancy information that is generated for each segment. For instance, staging area 236 includes multiple buffers including a buffer 238 that contains an encoded segment field 240 and a parity field 242. Encoded segment field 240 is partitioned into multiple fragment fields into which the segment-level fragments of an encoded segment are inserted. Parity field 242 may also be partitioned into multiple parity field fragments into which the parity fragments are inserted. The identifiers of the storage-level fragments are maintained and associated with corresponding encoded segment identifier within a fragment index 244.

Storage node 230a further comprises a drive interface 248 that transmits and receives object fragments between storage node 230a and storage media devices 252, 254, and 256. In some aspects, each storage node has dedicated storage media devices associated with it. In some aspects, each storage node can talk with any other storage media device, as shown. A fragment layout unit 246 determines the storage destinations among the storage media devices for the storage level fragments stored within buffers 236. In some aspects, fragment layout unit 246 is configured, using any combination of coded software, firmware, and/or hardware, to allocate and select physically contiguous areas on the storage media referred to herein as "zones." Fragment layout unit 246 further organizes multiple zones into zone sets, to each of which fragment layout unit 246 (via drive interface 248) writes an individual set of storage-level fragments that correspond to a single encoded segment.

In an aspect, fragment layout unit 246 generates a zone index 250 that identifies individual zones and associates the zone IDs with respective storage media addresses (e.g., beginning and ending address). Each of the zone index entries may further associate the zone ID with a corresponding storage media device ID. Fragment layout unit 246 may identify and allocate zones for each of the storage media devices and determine which of the zones are available to receive object data (i.e., are "open"). Fragment layout unit 246 further selects sets of the open zones and identifies each individual zone as belonging to a zone within zone index 250. Fragment layout unit 246 further determines and assigns each of the zone sets as being available to receive object data (i.e., active) or not available (i.e., inactive). When a set of storage-level fragments corresponding to an encoded segment is received, fragment layout unit 246 assigns the fragments to a specified zone set to which the set is written. In this manner, each individual fragment (segment-level and protection) is written to a different storage media device.

If a storage media device, such as a magnetic drive, or a subcomponent, such as a platter is lost, each zone and corresponding object data stored therein can be identified using information from zone index 250. Each lost zone can then be efficiently rebuilt using the fixed rate erasure coding (Reed-Solomon in the depicted example) applied by encode/decode unit 234. Since the parity zones (i.e., zones storing parity fragments) and data zones used for reconstruction may be evenly spread across the remaining storage media devices, the reconstruction I/O load is distributed among these devices. No network traffic across network 235 is required to rebuild zones and reconstructed zones can be stored on other local storage media devices without having to replace the failed drives.

The segment-level protection provided by storage nodes 230a-230n enables each segment to be reconstructed at each storage node based on the parity level determined by encode-decode unit 234 and device distribution determined by fragment layout unit 246. If the number of failed storage components containing a zone for a particular segment exceeds the parity protection, the lost zones and corresponding segment cannot be recovered locally within the storage node. Remaining non-parity zones still contain object data that may be utilized for the object-level protection components of front-end node 205 to reconstruct the effected data object. A failure detect unit 249 may be used to both detect when zones and corresponding storage-level fragments have been lost, such as due to storage device failure. In response to determining that a zone has been lost, failure detect unit 249 may flag a corresponding zone entry within zone index 250.

Figure 3:
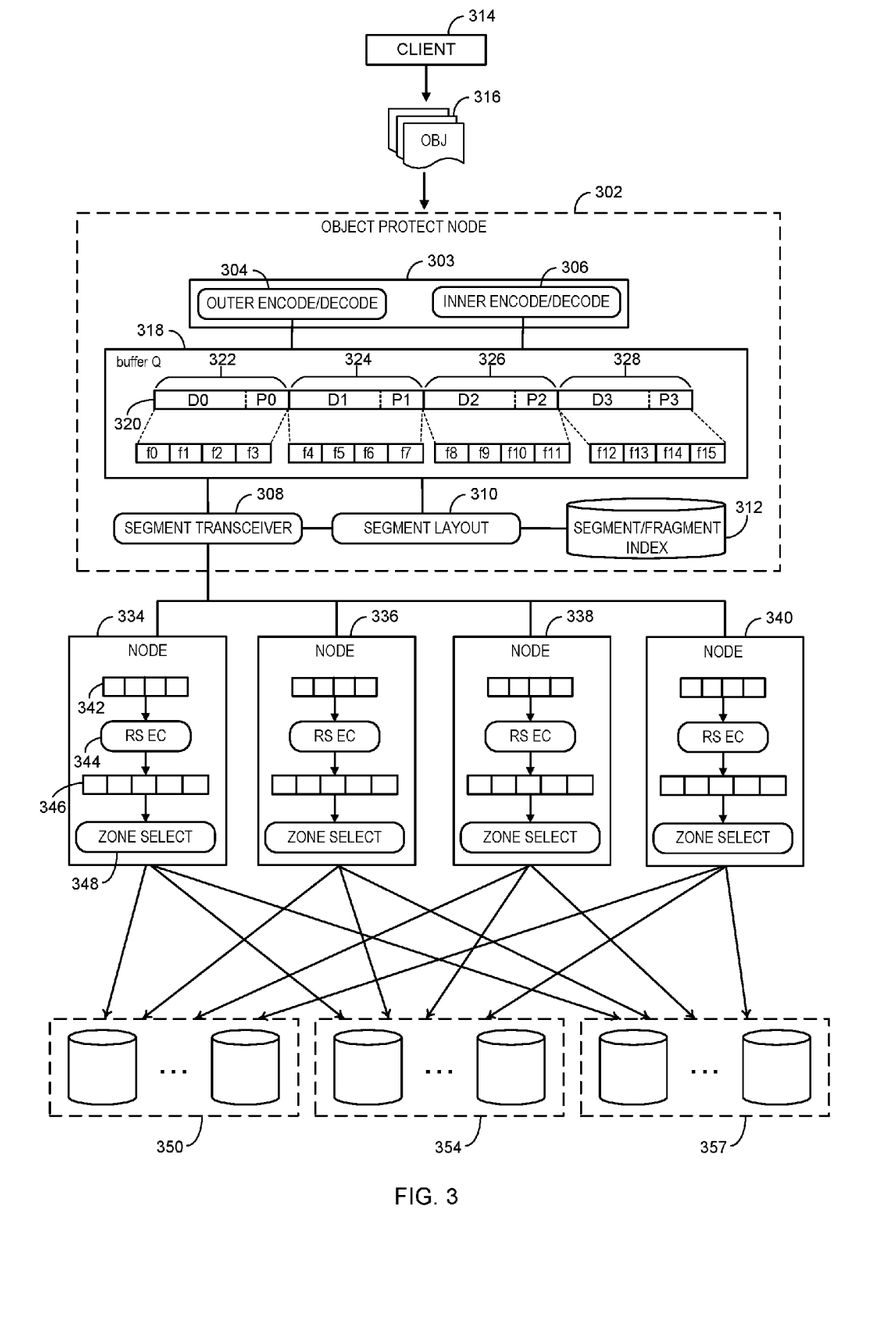
FIG. 3 is a block diagram depicting components of and data structures generated by an object protection node and multiple segment protection modes in accordance with some aspects.

FIG. 3 is a block diagram depicting components of and data structures generated by an object protection node and multiple segment protection modes in accordance with some aspects. As shown, an object protect node 302 receives a multiple objects 316 from a client node 314. For example, client node 314 may be a storage server that is replicating or archiving objects 316 to a storage system that comprises object protect node as a front-end node. In some aspects, object protect node 302 may include some or all of the object-level protection components and features included within front-end node 205.

The objects 316 may be transmitted to object protect node 302 as part of individual object write requests (e.g., PUT requests) or may be included within a replication or archival cycle having its own write command convention. In response to receiving the write request(s), object protect node 302 extracts an object which is then encoded using a rateless encoding unit 303 comprising an outer encode/decode unit 304 and an inner encode/decode unit 306. In some aspects, rateless encoding unit 303 may be a RaptorQ coding unit that applies outer and inner level encoding/decoding. Object data is streamed into an object buffer 320 within a buffer queue 318 where the source object data is divided into multiple source data segments. In the depicted aspect, buffer 320 includes four source data ranges, D0, D1, D2, and D3, into which the object data is inserted. Outer encode/decode unit 304 processes the four source data segments to generate redundancy information which is inserted into four protection ranges, P0, P1, P2, and P3, which are interleaved with the data ranges. Outer encode/decode unit 304 may apply a fixed rate erasure code to generate the redundancy/parity information. Each of source/parity data pairs D0:P0, D1:P1, D2:P2, and D3:P3 form pre-coded segments 322, 324, 326, and 328.

The pre-coded segments are then encoded by inner encode/decode unit 306 to generate 16 (n) encoded fragments f0-f15 distributed among the four segments. Per rateless erasure encoding, and assuming that the parity data consumes four fragments (n-k), the entire original source object data can be reconstructed from any 12 (k) of the fragments f0-f15. In some aspects, inner encode/decode unit applies Luby transform encoding to generate fragments f0-f15 (segment-level fragments) of the encoded segments comprising fragments f0-f3, f4-f7, f8-f11, and f12-f15, respectively. In alternate aspect, rateless encoding unit 303 may implement other rateless coding such as other Fountain-class codes.

Object protect node 302 further comprises a segment layout unit 310 that associates encoded segment IDs with corresponding segment-level fragment IDs within an index 312. Segment layout unit 310 is further configured to determine the storage node locations of each of the encoded segments and to transmit the encoded segments accordingly via a segment transceiver 308. In the depicted aspect, each of the encoded segments is transmitted to a respective one of storage nodes 334, 336, 338, and 340. For example a encoded segment 342 comprising four segment-level fragments is received by storage node 334. Optionally, a Reed-Solomon encoder 344 re-encodes encoded segment 342 to generate parity information which is inserted into a parity fragment. A set 346 of storage-level fragments corresponding to a single encoded segment is thereby formed and processes by a fragment layout unit 348 to provide optimal partitioning of each of the fragments among different ones of storage components 350, 354, and 357.

Figure 4:
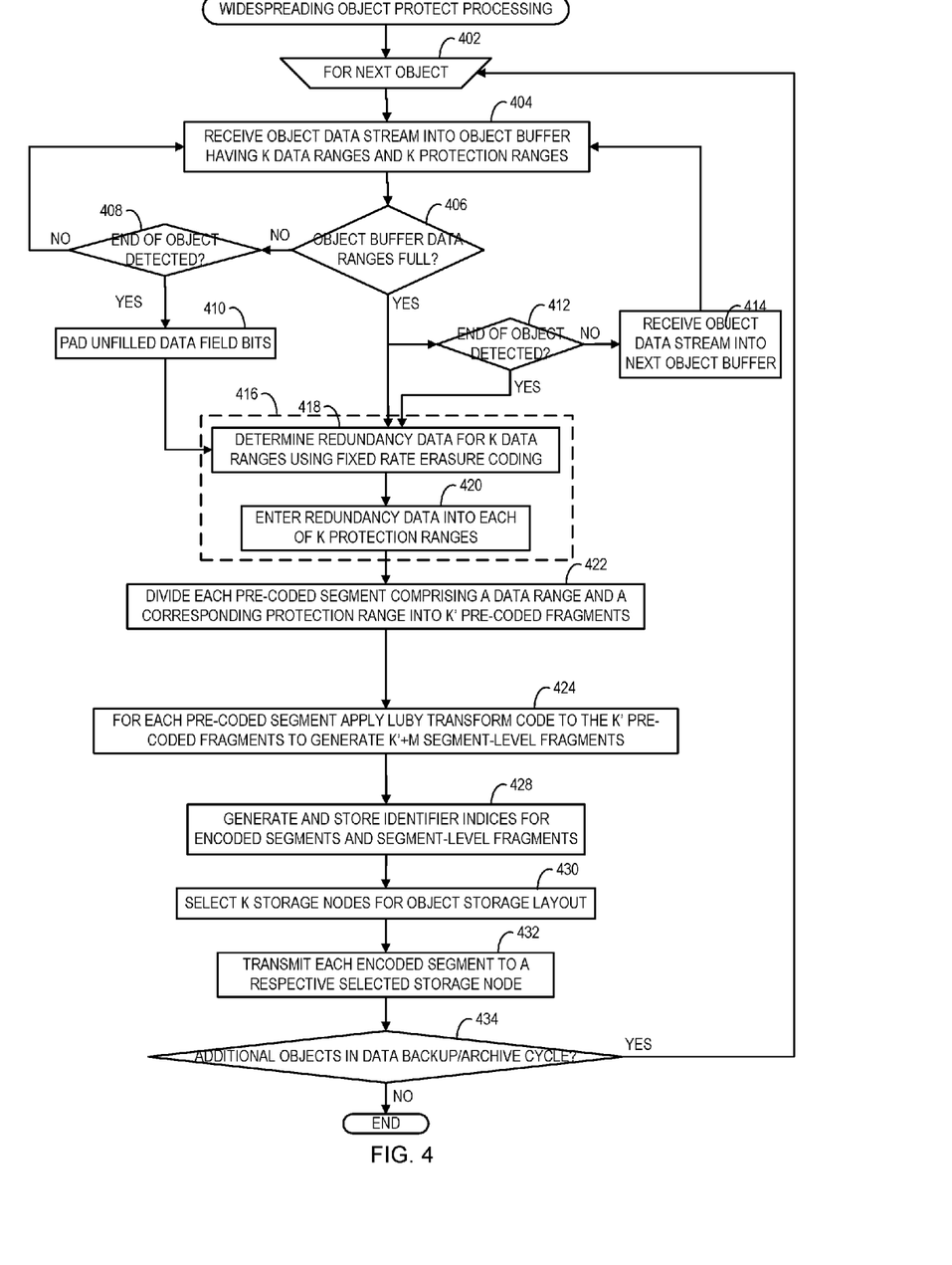
FIG. 4 is a flow diagram illustrating operations and functions performed by an object protect node to support hierarchical wide spreading in accordance with some aspects.

FIG. 4 is a flow diagram illustrating operations and functions performed by an object protect node to support hierarchical wide spreading in accordance with some aspects. The operations and functions depicted in FIG. 4 may be performed by some of the systems and components depicted and described with reference to FIGS. 1-3. The process begins for a next object that is received by a front-end node (block 402) and the object data is extracted and inserted into an object buffer (block 404). The object buffer includes k data ranges into which the object data is received and k interleaved protection ranges. As shown at blocks 406 and 408, the object data is streamed into the object buffer until either the complete object has been buffered or the data ranges in the data buffer are full. If all of the object's data is buffered prior to the buffer being full, control passes to block 410 with a component of the front-end node padding the buffer with zeros to fill the data ranges. If the data ranges are filled before the end of object is detected (block 412) control passes to block 414 with the object's remaining data being streamed to a next object buffer.

Once the data ranges for the object buffer are filled, the content of the object buffer is processed by a rateless erasure encoding unit. At superblock 416, the encoding unit pre-codes the k data ranges using a fixed rate erasure encoding to generate pre-coded segments. The encoding unit determines redundancy data for the k data ranges using the fixed rate erasure encoding and enters fixed-size sub-portions of the redundancy data into the k protection ranges to form the k pre-coded segment (blocks 418 and 420). Control passes to block 422 with the encoder dividing each of the k pre-coded segments into k' fragments to be processed as a series of symbols by an inner encoding. For example, assume 16 pre-coded segments that each comprise a data range and a parity range. The encoder may divide each of the data range parity range segments into 16 fragments to be processed by the inner encoding. For each pre-coded segment the encoder applies the inner encoding which may be a Luby transform encoding to generate a series of segment-level fragments (block 424). Continuing with the example of 16 fragments per pre-coded segment, the Luby transform encoding may generate a set of 18 fragments. Each of the respective sets of 18 fragments corresponding to a segment forms an encoded segment. The 18 fragments generated for each of the 16 encoded segments results in a total of 288 fragments per segment of which any 224 can be used to reconstruct the object data.

At block 428, components of the front-end node generate entries within a segment index and a fragment index to associate the encoded segment IDs with corresponding object IDs and to further map the segment IDs with the segment-level fragment IDs. A segment layout unit may then select k storage nodes to which to transmit the k encoded segments (block 430). Upper-level processing by the front-end continues with transmitting the encoded segments to selected storage nodes (block 432) until no additional objects remain to be processed (block 434).

Figure 5:
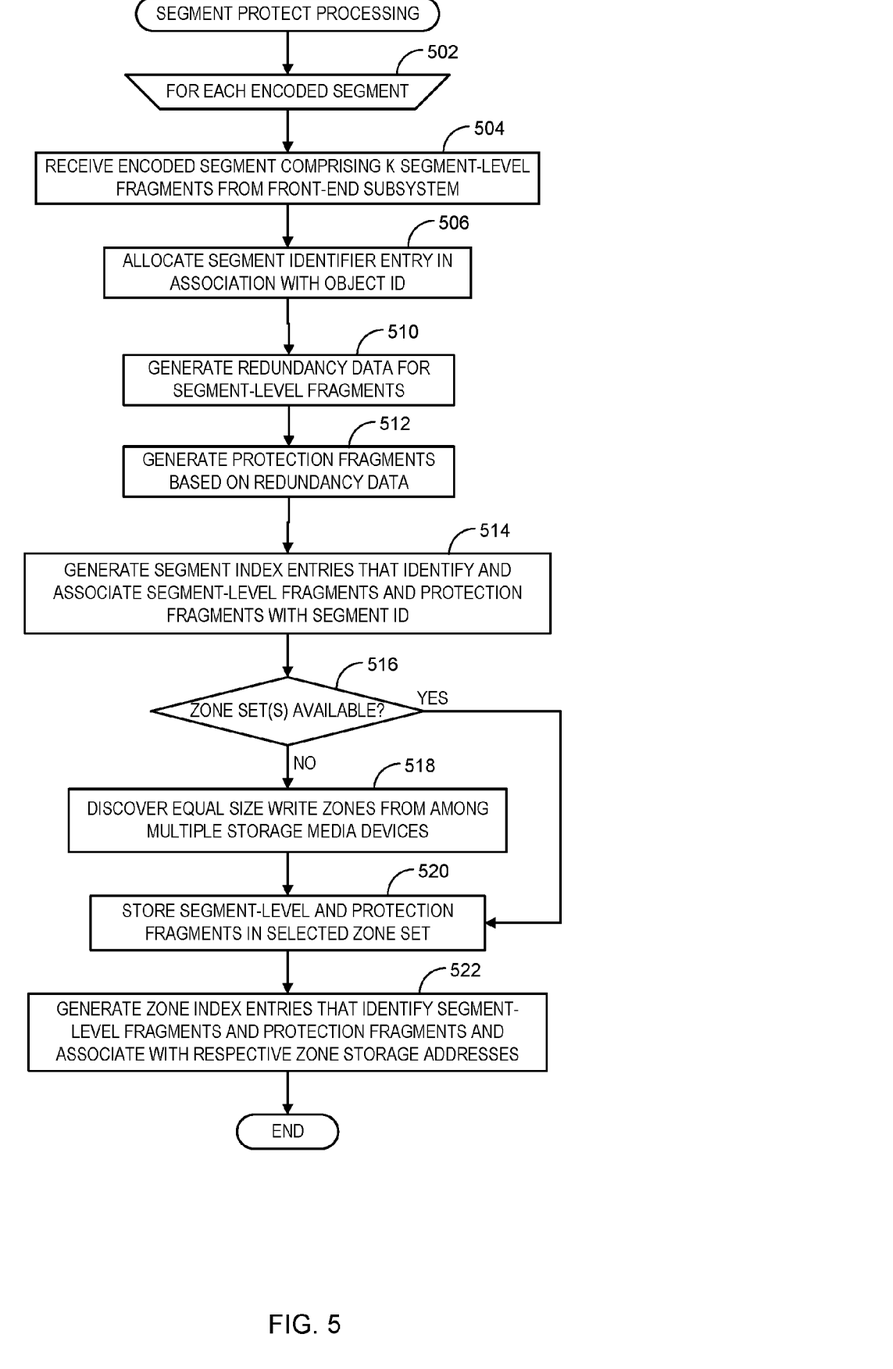
FIG. 5 is a flow diagram depicting operations and functions performed by a segment protect node to support hierarchical wide spreading in accordance with some aspects.

FIG. 5 is a flow diagram depicting operations and functions performed by a segment protect node to support hierarchical wide spreading in accordance with some aspects. The operations and functions depicted in FIG. 5 may be performed by systems and components depicted and described with reference to FIGS. 1-3. The process begins as shown at blocks 502 and 504 with each encoded segment for an object being received a different storage nodes as selected by a front-end node. Each of the received encoded segments comprises k (i.e., 18) fragments that were generated by a rateless erasure encoder. At block 506, each storage node allocates a segment ID entry in which an encoded segment ID is associated with an object ID of the object from which the encoded segment was generated. A fixed rate erasure encoder, such as a Reed-Solomon encoder within each of the storage nodes may optionally generate redundancy data (block 510) and generates parity fragments (block 512) for each of the respective encoded segments. Since in some aspects segment-level protection has already been implemented (FIG. 4 block 424), the RS coding at blocks 510 and 512 may be optional, and only required if certain rebuild efficiencies are required beyond the rateless coding provided by the object protection code. The generated parity fragments together with the corresponding segment-level fragments form a set of storage-level fragments for each of the encoded segments. For example, if each encoded segment comprises 18 fragments, the fixed rate erasure encoder may generate two parity fragments, resulting in a total of 20 storage-level fragments.

Next, at block 514, the storage node generates segment index entries that identify and associate the storage-level fragments (i.e., the segment-level and parity fragments) with a respective encoded segment ID. Maintenance of the entries within a fragment index enables fragments to be identified and associated with a particular segment. The process continues at block 516 with a fragment layout unit determining availability of active zones sets. If no available zone sets are immediately identifiable, the fragment layout unit may commence a discovery phase to identify candidate zones and zones sets (block 518). Having identified an available zone set, the fragment layout unit stores the storage level fragments to the zones specified in the available zone set (block 520). The process ends with each of the storage nodes generating zone index entries that record the location of storage level fragments among the zones (block 522).

Figure 6:
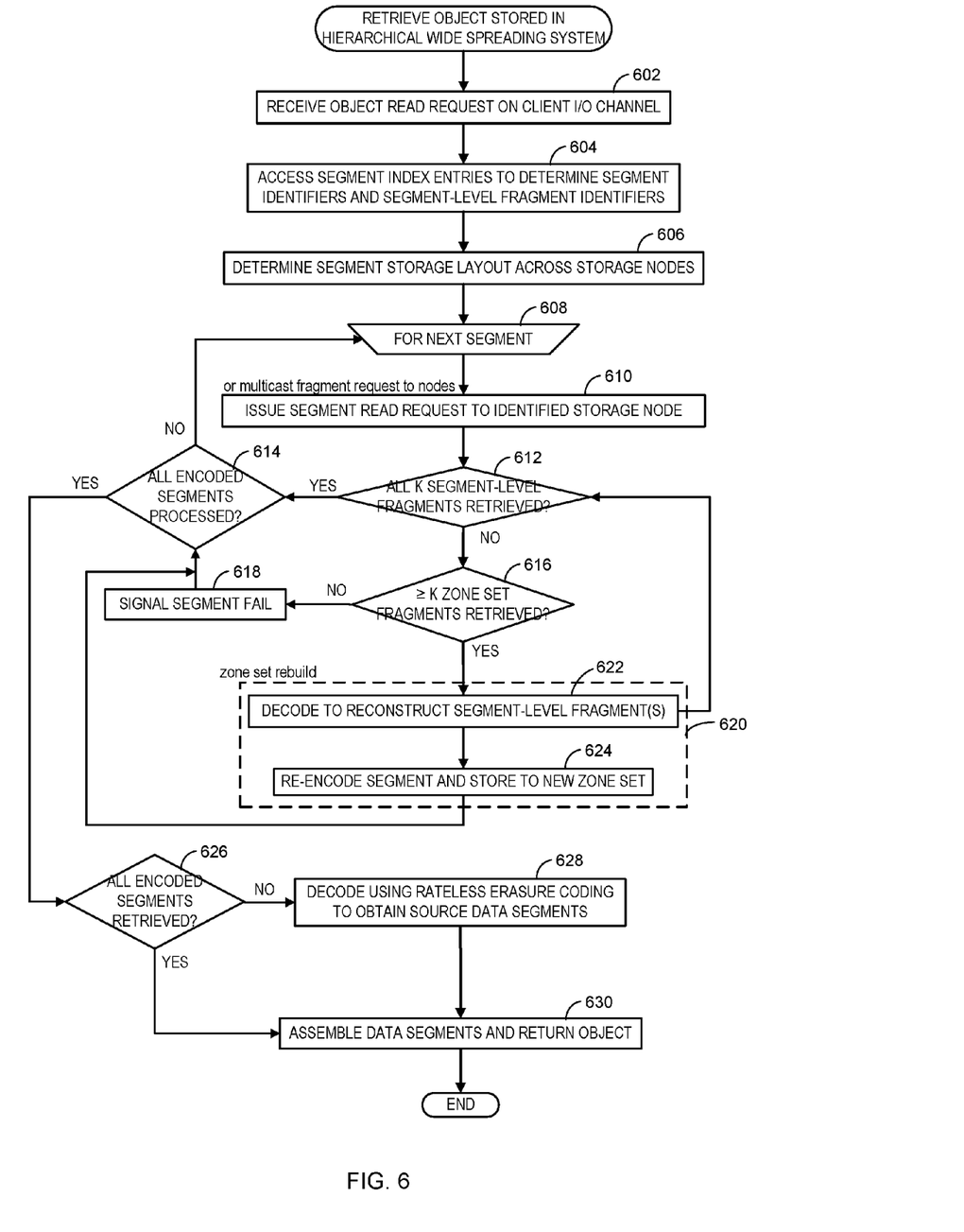
FIG. 6 is a flow diagram illustrating operations and functions performed by an object protect node and multiple segment protect nodes to reconstruct or read objects or portions of objects stored in a hierarchical wide spreading format in accordance with some aspects.

FIG. 6 is a flow diagram illustrating operations and functions performed by an object protect node and multiple storage nodes to reconstruct or read objects or portions of objects stored in a hierarchical wide spreading format in accordance with some aspects. The operations and functions depicted in FIG. 6 may be performed by components depicted and described with reference to FIGS. 1-3. The process begins as shown at block 602 with a front-end node receiving an object read request from a client node. The front-end node may access a segment index and a fragment index, such as segment and fragment indices 220 and 224, to determine segment identifiers and corresponding fragment identifiers based on an object ID included in the read request (block 604).

Having identified the constituent segments for the request object, the front-end node may utilize a segment layout unit to determine information about whether the segments have been stored (block 606). For example, the segment layout unit may utilize the segment and/or fragment identifiers in conjunction with recorded segment layout data to identify the storage nodes at which the segments are stored. The front-end node then begins a segment retrieval cycle for each segment and directed to each storage node on which the segment is determined to be stored. Beginning at block 608, for a next segment of the requested object the front-end node issues a segment read request to the identified storage node requesting retrieval of a specified encoded segment (block 610). In an alternate aspect, the front-end node may multicast a segment read request to all of the multiple storage nodes across which all segments for the object are stored.

The storage node responds to the request by accessing a fragment ID and zone indices to identify the particular storage media devices across which the segment is stored and to retrieve the corresponding fragments. If any of the segment-level fragments (i.e., non-parity fragments) are missing, the storage node may further decode the storage-level fragments to recover the segment-level fragments which may be returned to the front-end node. As shown at block 612 and 616, if the storage node is unsuccessful in retrieving the k segment-level fragments (i.e., the non-parity storage-level fragments), the storage node signals a failure for retrieval of the segment and returns the surviving fragments. Control passes to block 614, at which if addition segments remain to be processed, control returns to block 608 for processing of a next segment.

Returning to block 616, if one or more of the k segment-level fragments were not successfully retrieved, but at least k of the total storage-level fragments were retrieved, the storage node commences a zone set rebuild cycle at block 620. First, a fixed rate decoder or rateless decoder within the storage node decodes the at least k storage level fragments (block 622). The fixed rate decoder or rateless decoder retrieves data and parity fragments to reconstruct the encoded segment by regenerating the one or more lost segment-level fragments (block 624). The storage node may then store all zone set fragments of the segment to a new zone set. Control passes to block 614 with a determination of whether all segments have been processed. If not, control returns to block 608 and if so, control passes to block 626 with a determination of whether all processed segments were successfully retrieved. For instance, one or more of the storage nodes may determine that less than k segments were retrieved at block 616 for one of more of the encoded segments. If so, the corresponding storage node may send a segment read fail signal to the front end node. At block 628, the front-end node may respond to the segment read fail signal by collecting the remaining segment-level fragments of the missing segment and the segment-level fragments of the successfully retrieved segments to reconstruct the data object source data. In some aspect, the front-end node may apply rateless erasure decoding to the collected fragments to reconstruct the object source data. Following reconstruction of the source data segments, the front-end node may assemble the segments and return the requested object to the requesting client (block 630).

Variations

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality provided as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 7:
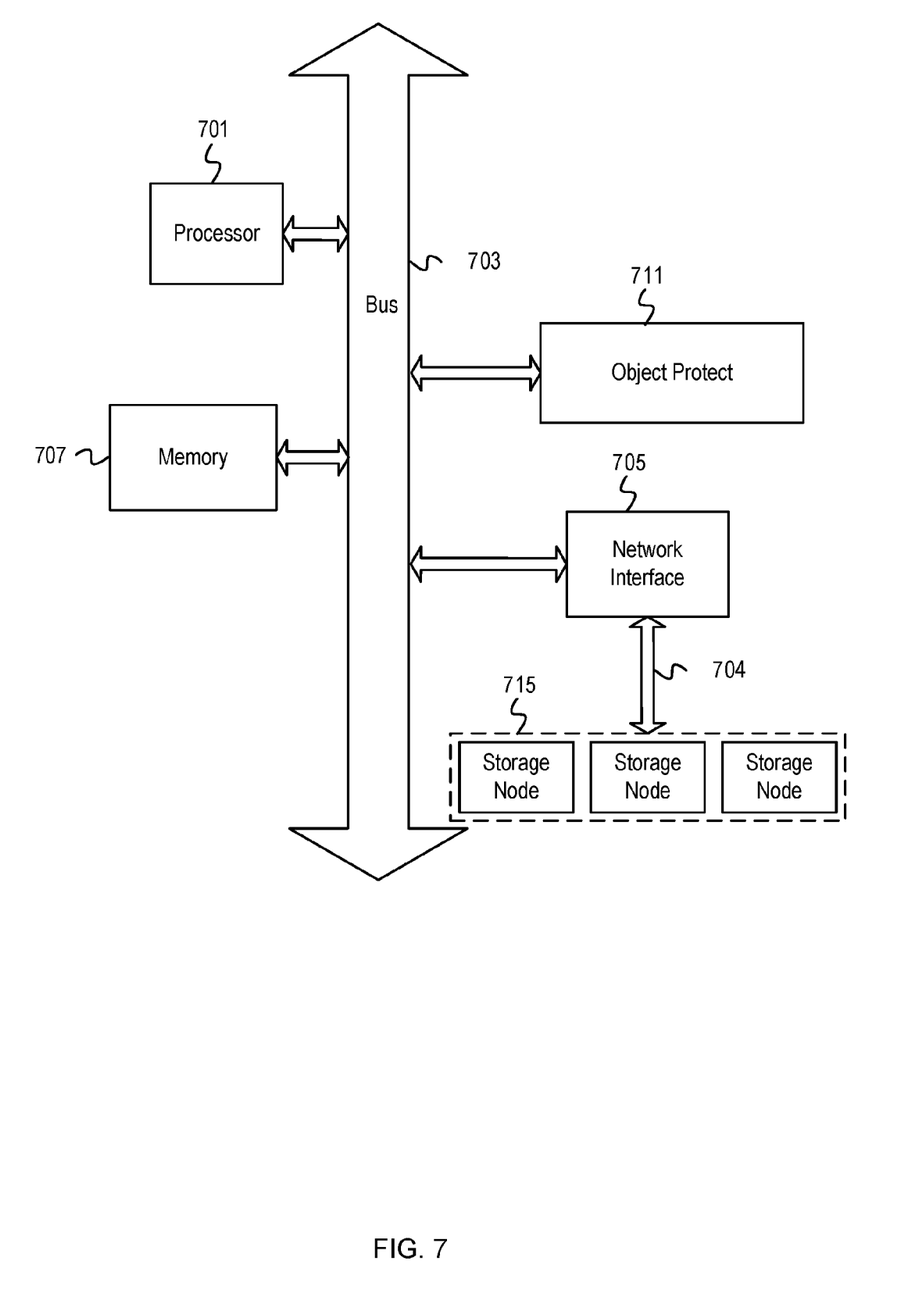
FIG. 7 depicts an example computer system that implements hierarchical wide spreading in accordance with some aspects.

FIG. 7 depicts an example computer system that implements a hierarchical wide spreading architecture in accordance with an aspect. The computer system includes a processor unit 701 (possibly including multiple processors, multiple cores, multiple nodes, and/or implementing multithreading, etc.). The computer system includes memory 707. The memory 707 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 703 (e.g., PCI, ISA, PCI-Express, HyperTransport® bus, InfiniBand® bus, NuBus, etc.) and a network interface 705 (e.g., a Fiber Channel interface, an Ethernet interface, an internet small computer system interface, SONET interface, wireless interface, etc.). The system also includes an object processing unit 711. The object processing unit 711 provides program structures for processing write requests (e.g., object PUT requests), individually or as part of a replication or object archival cycle.

The system further includes a set of backend storage nodes 715 that are communicatively coupled to object processing unit 711 via a network 704. Each of the backend storage nodes includes a control board and multiple storage media devices 715 that may be solid storage devices, an array of disk drives, a hybrid of different storage media devices, etc.

Any one of the previously described functionalities may be partially (or entirely) implemented in hardware and/or on the processor unit 701. For example, the functionality may be implemented with an application specific integrated circuit, in logic implemented in the processor unit 701, in a co-processor on a peripheral device or card, etc. Further, realizations may include fewer or additional components not illustrated in FIG. 7 (e.g., video cards, audio cards, additional network interfaces, peripheral devices, etc.). The processor unit 701 and the network interface 705 are coupled to the bus 703. Although illustrated as being coupled to the bus 703, the memory 707 may be coupled to the processor unit 701.

While the aspects of the disclosure are described with reference to various implementations and exploitations, it will be understood that these aspects are illustrative and that the scope of the claims is not limited to them. In general, techniques for an object storage backed file system that efficiently manipulates namespace as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality shown as separate components in the example configurations may be implemented as a combined structure or component. Similarly, structures and functionality shown as a single component may be implemented as separate components. These and other variations, modifications, additions, and improvements may fall within the scope of the disclosure.

What is claimed is:

1. A method for managing data storage between a front-end node and multiple storage nodes, said method comprising:
   in response to a request to write an object, the front-end node dividing the object into multiple source data segments;
   the front-end node generating redundancy data for the multiple source data segments using a rateless erasure encoding;
   the front-end node associating a respective subset of the redundancy data with each of the multiple source data segments, wherein each subset of redundancy data and associated source data segment form an encoded segment;
   the front-end node defining multiple segment-level fragments within each of the encoded segments;
   the front-end node transmitting each of the encoded segments to a selected one of multiple storage nodes, wherein each of the selected storage nodes are selected based on a determined storage layout of the encoded segments across the multiple storage nodes; and
   for each of the encoded segments received at each of the selected storage nodes, at least one of the storage nodes,
      generating one or more protection fragments based on redundancy data generated from the segment-level fragments; and
      storing the segment-level fragments and corresponding protection fragments across multiple storage media devices managed by the selected storage node.

2. The method of claim 1, wherein said generating one or more protection fragments based on redundancy data determined for the segment-level fragments comprises encoding the segment-level fragments using a fixed rate erasure code.

3. The method of claim 1, further comprising maintaining an identifier index for the segment-level fragments within the front-end node that is communicatively coupled to the selected storage nodes via network connections.

4. The method of claim 1, further comprising, for each of the encoded segments received by a corresponding one of the storage nodes, maintaining an identifier index for the segment-level fragments and the protection fragments within the corresponding storage node.

5. The method of claim 1, wherein said generating redundancy data for the source data segments comprises:
   receiving object data into data ranges of a buffer having k data ranges and k protection ranges;
   precoding each of the k data ranges by,
      determining redundancy data for the k data ranges using fixed rate erasure encoding; and
      entering a subset of the determined redundancy data for the k data ranges into each of the k protection ranges, wherein each of the k data ranges and a corresponding one of the k protection ranges form a pre-coded segment; and
      encoding the pre-coded segments using a Luby transform code to form the encoded segments.

6. The method of claim 5, further comprising:
   dividing each of the pre-coded segments into k' pre-coded fragments; and
   wherein said encoding the pre-coded segments includes, for each pre-coded segment,
      applying the Luby transform code to the k' pre-coded fragments to generate a sequence of encoded symbols comprising k'+m segment-level fragments, wherein m is greater than or equal to one.

7. The method of claim 1, wherein said storing the segment-level fragments and corresponding protection fragments across multiple storage devices comprises:
   selecting a zone set comprising a fixed number of physically contiguous storage areas within a fixed number of storage media devices; and
   assigning each of the segment-level fragments and protection fragments to be stored at respective ones of the physically contiguous storage areas within the fixed number of storage media devices.

8. The method of claim 1, further comprising:
   generating index entries that associate address information for the physically contiguous storage areas with the segment-level fragments and protection fragments stored thereon.

9. A non-transitory machine readable medium having stored thereon instructions for performing a method, wherein the instructions comprise machine executable code which when executed by at least one machine, causes the machine to:

in response to a request to write an object, divide the object into multiple source data segments;

generate redundancy data for the multiple source data segments using a rateless erasure encoding;

associate a respective subset of the redundancy data with each of the multiple source data segments, wherein each subset of redundancy data and associated source data segment form an encoded segment;

define multiple segment-level fragments within each of the encoded segments;

transmit each of the encoded segments to a selected one of multiple storage nodes, wherein each of the selected storage nodes are selected based on a determined storage layout of the encoded segments across the multiple storage nodes; and     for each of the encoded segments received at each of the selected storage nodes,         generate one or more protection fragments based on redundancy data generated from the segment-level fragments; and         store the segment-level fragments and corresponding protection fragments across multiple storage media devices managed by the selected storage node.

10. The non-transitory machine readable medium of claim 9, wherein said generating one or more protection fragments based on redundancy data determined for the segment-level fragments comprises encoding the segment-level fragments using a fixed rate erasure code.

11. The non-transitory machine readable medium of claim 9, wherein the instructions comprise machine executable code which when executed by at least one machine, causes the machine to, for each of the encoded segments received by a corresponding one of the storage nodes, maintain an identifier index for the segment-level fragments and the protection fragments within the corresponding storage node.

12. The non-transitory machine readable medium of claim 9, wherein said generating redundancy data for the source data segments comprises:

receiving object data into data ranges of a buffer having k data ranges and k protection ranges;

precoding each of the k data ranges by, determining redundancy data for the k data ranges using fixed rate erasure encoding; and         entering a subset of the determined redundancy data for the k data ranges into each of the k protection ranges, wherein each of the k data ranges and a corresponding one of the k protection ranges form a pre-coded segment; and     encoding the pre-coded segments using a Luby transform code to form the encoded segments.

13. The non-transitory machine readable medium of claim 12, wherein the instructions comprise machine executable code which when executed by at least one machine, causes the machine to:

divide each of the pre-coded segments into k' pre-coded fragments; and     wherein said encoding the pre-coded segments includes, for each pre-coded segment,         applying the Luby transform code to the k' pre-coded fragments to generate a sequence of encoded symbols comprising k'+m segment-level fragments, wherein m is greater than or equal to one.

14. The non-transitory machine readable medium of claim 9, wherein said storing the segment-level fragments and corresponding protection fragments across multiple storage devices comprises:

selecting a zone set comprising a fixed number of physically contiguous storage areas within a fixed number of storage media devices; and     assigning each of the segment-level fragments and protection fragments to be stored at respective ones of the physically contiguous storage areas within the fixed number of storage media devices.

15. The non-transitory machine readable medium of claim 9, wherein the instructions comprise machine executable code which when executed by at least one machine, causes the machine to:

generate index entries that associate address information for the physically contiguous storage areas with the segment-level fragments and protection fragments stored thereon.

16. A computing device comprising:

a memory comprising machine readable media that contains machine executable code;

a processor coupled to the memory, the processor configured to execute the machine executable code to cause the processor to:

in response to a request to write an object, divide the object into multiple source data segments;

generate redundancy data for the multiple source data segments using a rateless erasure encoding;

associate a respective subset of the redundancy data with each of the multiple source data segments, wherein each subset of redundancy data and associated source data segment form an encoded segment;

define multiple segment-level fragments within each of the encoded segments;

transmit each of the encoded segments to a selected one of multiple storage nodes, wherein each of the selected storage nodes are selected based on a determined storage layout of the encoded segments across the multiple storage nodes; and         for each of the encoded segments received at each of the selected storage nodes,             generate one or more protection fragments based on redundancy data generated from the segment-level fragments; and             store the segment-level fragments and corresponding protection fragments across multiple storage media devices managed by the selected storage node.

17. The computing device of claim 16, wherein the processor is configured to execute the machine executable code to cause the processor to, for each of the encoded segments received by a corresponding one of the storage nodes, maintain an identifier index for the segment-level fragments and the protection fragments within the corresponding storage node.

18. The computing device of claim 16, wherein said generating redundancy data for the source data segments comprises:

receiving object data into data ranges of a buffer having k data ranges and k protection ranges;

precoding each of the k data ranges by, determining redundancy data for the k data ranges using fixed rate erasure encoding; and         entering a subset of the determined redundancy data for the k data ranges into each of the k protection ranges, wherein each of the k data ranges and a corresponding one of the k protection ranges form a pre-coded segment; and encoding the pre-coded segments using a Luby transform code to form the encoded segments.

19. The computing device of claim 18, wherein the processor is configured to execute the machine executable code to cause the processor to:

divide each of the pre-coded segments into k' pre-coded fragments; and wherein said encoding the pre-coded segments includes, for each pre-coded segment, applying the Luby transform code to the k' pre-coded fragments to generate a sequence of encoded symbols comprising k'+m segment-level fragments, wherein m is greater than or equal to one.

20. The computing device of claim 16, wherein said storing the segment-level fragments and corresponding protection fragments across multiple storage devices comprises:

selecting a zone set comprising a fixed number of physically contiguous storage areas within a fixed number of storage media devices; and assigning each of the segment-level fragments and protection fragments to be stored at respective ones of the physically contiguous storage areas within the fixed number of storage media devices.

\* \* \* \* \*